US009575759B2

(12) United States Patent
Cho

(10) Patent No.: US 9,575,759 B2
(45) Date of Patent: Feb. 21, 2017

(54) MEMORY SYSTEM AND ELECTRONIC DEVICE INCLUDING MEMORY SYSTEM

(71) Applicant: Samsung Electronics Co., Ltd., Suwon-si (KR)

(72) Inventor: Sang-Yeun Cho, Seongnam-si (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 45 days.

(21) Appl. No.: 14/624,596

(22) Filed: Feb. 18, 2015

(65) Prior Publication Data

US 2015/0287442 A1     Oct. 8, 2015

(30) Foreign Application Priority Data

Apr. 8, 2014  (KR) .................... 10-2014-0042022

(51) Int. Cl.
  *G06F 9/30*     (2006.01)
  *G06F 12/00*    (2006.01)
  *G11C 7/10*     (2006.01)

(52) U.S. Cl.
  CPC ........... *G06F 9/30141* (2013.01); *G06F 12/00* (2013.01); *G11C 7/1006* (2013.01); *G11C 2207/2236* (2013.01)

(58) Field of Classification Search
  CPC .... G06F 12/00; G06F 9/30141; G11C 7/1006; G11C 2207/2236
  USPC .................................................. 711/103, 109
  See application file for complete search history.

(56) References Cited

U.S. PATENT DOCUMENTS

| 6,873,556 B2 | 3/2005 | Hanji et al. |
| 7,020,746 B2 | 3/2006 | Brown et al. |
| 7,290,109 B2 | 10/2007 | Horii et al. |
| 7,409,516 B2 | 8/2008 | Teh et al. |
| 7,676,646 B2 | 3/2010 | Cohen |
| 8,006,072 B2 | 8/2011 | Cook et al. |
| 8,132,045 B2 * | 3/2012 | Avila .................... G06F 11/141 711/103 |
| 8,218,373 B2 | 7/2012 | Nakamura et al. |
| 8,375,163 B1 | 2/2013 | Edmondson et al. |
| 2004/0049649 A1 | 3/2004 | Durrant |
| 2005/0076189 A1 | 4/2005 | Wittenburg et al. |
| 2006/0036817 A1 * | 2/2006 | Oza ....................... G06F 9/3816 711/155 |

FOREIGN PATENT DOCUMENTS

JP       2008-225608 A     9/2008

OTHER PUBLICATIONS

Xiaowei Jiang et al. / Architecture Support For Improving Bulk Memory Copying and Initialization Performance / 12 Pages.

* cited by examiner

*Primary Examiner* — Jasmine Song
(74) *Attorney, Agent, or Firm* — Muir Patent Law, PLLC

(57) ABSTRACT

A memory system processing data according to a received first request may include a main memory and a memory controller. The main memory may comprise a first area and a second area, and may be configured to provide data from the first area to the second area. The memory controller may comprise a scoreboard configured to indicate that a first piece of sub-data of a first set of sub-data of the data has been provided from the first area to the second area. Based on the scoreboard, the memory controller may be configured to perform processing of the first request by using the first piece of sub-data before providing of other pieces of sub-data of the first set of sub-data from the first area to the second area is completed.

16 Claims, 15 Drawing Sheets

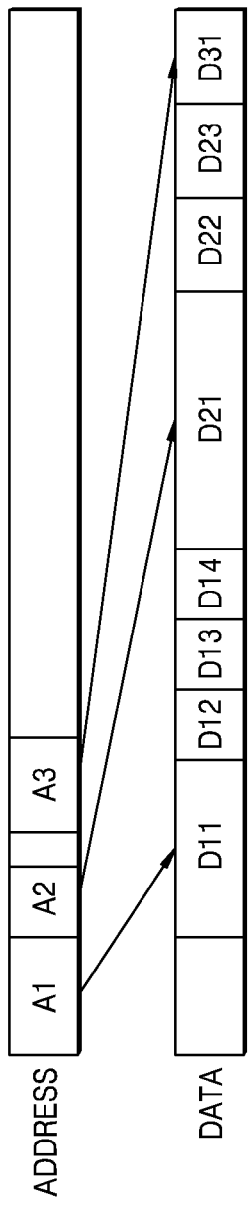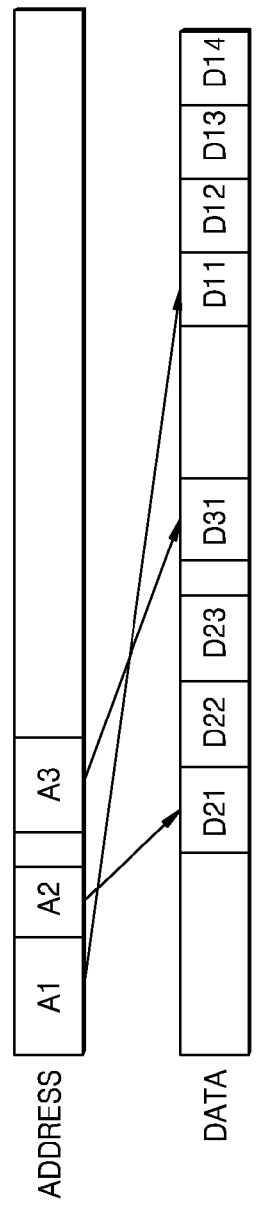

MEMORY SYSTEM AND ELECTRONIC DEVICE INCLUDING MEMORY SYSTEM

CROSS-REFERENCE TO RELATED APPLICATIONS

This application claims the benefit of priority to Korean Patent Application No. 10-2014-0042022, filed on Apr. 8, 2014, in the Korean Intellectual Property Office, the disclosure of which is incorporated herein in its entirety by reference.

BACKGROUND

The present disclosure relates to a memory system and an electronic device including the memory system, and more particularly, to a memory system capable of improving operational performance thereof and an electronic device including the memory system.

When an application is executed in an electronic device, data needed for execution of the application is typically loaded on a main memory. In doing so, a first operation of providing data to the main memory may cause a delay in a second operation of using the data provided to the main memory. Accordingly, various technologies for obtaining a memory system that may operate at a high efficiency have been developed.

SUMMARY

Various exemplary embodiments provide a memory system, which may improve operational performance thereof, and an electronic device including the memory system.

According to an exemplary embodiment, there is provided a memory system processing data according to a received first request. The memory system may include a first memory and a memory controller. The first memory may include a first area and a second area, and may be configured to provide data from the first area to the second area. The memory controller may include a scoreboard. The scoreboard may be configured to indicate that a first piece of sub-data of a first set of sub-data of the data has been provided from the first area to the second area. Based on the scoreboard, the memory controller may be configured to perform processing of the first request by using the first piece of sub-data before providing of other pieces of sub-data of the first set of sub-data from the first area to the second area is completed.

The first area may be a memory area assigned to an operating system and the second area may be a memory area assigned to an application.

The first set of sub-data may be copied from the first area to the second area.

The scoreboard may be configured to: store an in-use bit indicating whether provision of the first set of sub-data of the data to the second area is being performed, store a tag indicating a start address of the second area, and store a plurality of full/empty bits respectively indicating whether each piece of sub-data of the first set of sub-data has been provided to respective sub-area of the first set of sub-areas of the second area.

The scoreboard may include a first register set comprising a first register configured to store the in-use bit, a second register configured to store the tag, and a plurality of third registers each configured to store each of the plurality of full/empty bits corresponding to the first set of sub-areas of the second area.

The first request may be processed in units of macro operations, the second area may be set to have a size corresponding to the units of macro operations, and the plurality of third registers may be provided in a number corresponding to the units of macro operations.

The memory controller may differently set a size of each of the plurality of sub-areas indicated by one of the plurality of third registers according to a size of the data required for processing the first request.

The memory controller may include at least a second register set indicating whether provision of a second set of sub-data of the data has been provided to a second set of sub-areas of the second area, the plurality of third registers of the first register set comprises m registers each having k data bits, and a plurality of third registers of the second register set comprises n registers each having l data bits, m is equal to or different from n and k is equal to or different from l, and the memory controller may be configured to assign one of the first register set and the second register set based on a size of the data required for processing the first request.

When may be an i-th sub-data and an (i+1)th sub-data of the first set of sub-data are sequentially transmitted to the second area, and one of the plurality of full/empty bits indicates that the i-th sub-data may be the last sub-data transmitted to the second area, the memory controller may be configured to process the first request on the first set of sub-data up to the i-th sub-data and then interlock-process the first request on the (i+1)th sub-data.

A result of the processing of the first request by using the first set of sub-data provided to the second area may have been provided to a third area of the first memory, and the memory controller may be configured to process a second request by using data provided to the third area, before an operation performed based on the first request is completed.

The memory controller may include a control circuit configured to generate a first control signal indicating a control operation to process the first request, a scoreboard checking circuit configured to generate a second control signal based on a result of checking the scoreboard in response to the first control signal, a performing circuit configured to perform transmission of the data from the first area to the second area in a unit of a piece of sub-data, perform the first request by using the sub-data transmitted to the second area in response to the second control signal, and generate a third control signal, and a scoreboard updating circuit configured to update the scoreboard in response to the third control signal and generate a fourth control signal based on a result of the updating.

The first request may be for all pieces of sub-data of the first set of sub-data of the first area. The memory controller may further include a mode setting circuit that is configured to control the control circuit, the scoreboard checking circuit, the performing circuit, and the scoreboard updating circuit so that the first request is performed after the all of pieces of sub-data of the first set of sub-data are all transmitted from the first area to the second area, in response to a mode signal.

The first request may be received from a first device that is located outside the memory system and the first device is configured to execute an application related to the first request.

The memory system may further include a second memory that is configured to transmit data corresponding to the first request to the first memory or store data processed corresponding to the first request.

According to another exemplary embodiment, there is provided an electronic device. The electronic device may include a first device and a second device. The first device may be configured to execute an application. The second device may be configured to process data required to execute the application, in response to a first request of the first device. The second device may include a first memory and a memory controller. The first memory may comprise a first area and a second area, and may be configured to provide data from the first area to the second area. The memory controller may comprise a scoreboard configured to indicate that a first sub-data of a first set of sub-data of the data has been provided from the first area to the second area. Based on the scoreboard, the memory controller may be configured to perform processing of the first request of the first device by using the first sub-data while other sub-data of the first set of sub-data is being provided from the first area to the second area.

According to still another embodiment, there is provided a semiconductor device. The semiconductor device may include a first register set including a first set of registers. The first set of registers may configured to: indicate whether a first operation is being performed on a second area of a memory including a first area and the second area, and indicate whether the first operation is completed on a first sub-area of a first set of sub-areas of the second area. The semiconductor device may be configured to, while the first operation is being performed on the other sub-areas of the second area, perform a second operation using the result of the first operation on the first sub-area.

BRIEF DESCRIPTION OF THE DRAWINGS

Exemplary embodiments of the inventive concept will be more clearly understood from the following detailed description taken in conjunction with the accompanying drawings in which:

FIGS. 3A and 3B are diagrams illustrating examples of address and data transmitted via a bus in the first device of FIG. 1;

DETAILED DESCRIPTION OF THE EMBODIMENTS

Figure 1:
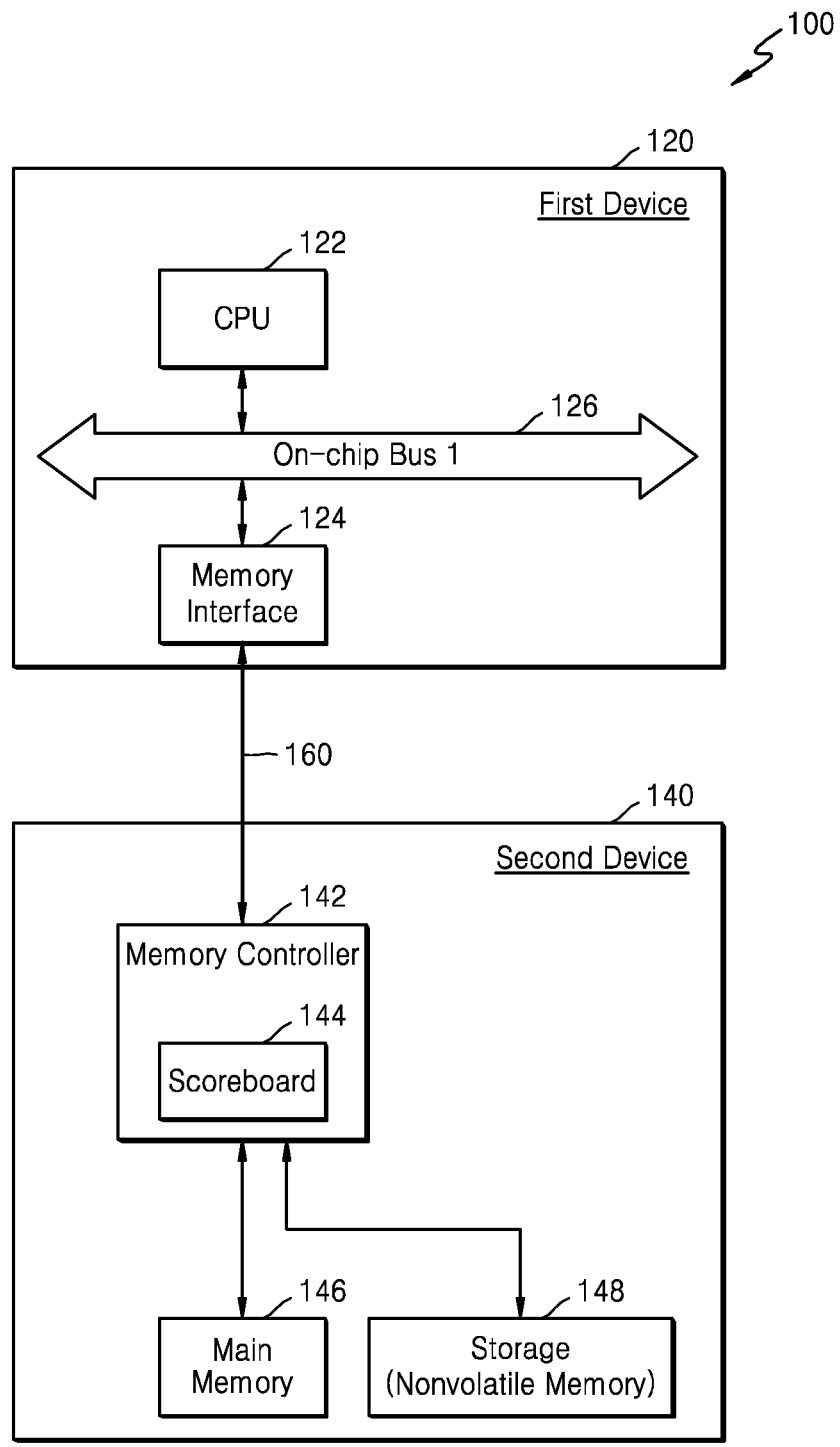
FIG. 1 is a block diagram illustrating an electronic device according to an exemplary embodiment.

Hereinafter, various example embodiments of the present inventive concept will be described in detail with reference to the accompanying drawings. However, the present inventive concept is not limited thereto and it will be understood that various changes in form and details may be made therein without departing from the spirit and scope of the following claims. That is, descriptions on particular structures or functions may be presented merely for explaining exemplary embodiments of the present inventive concept.

Terms used in the present specification are used for explaining a specific exemplary embodiment, not for limiting the present inventive concept. Thus, an expression used in a singular form in the present specification also includes the expression in its plural form unless clearly specified otherwise in context. Also, terms such as "include," "including," "comprise," and/or "comprising," may be construed to denote a certain characteristic, number, step, operation, constituent element, or a combination thereof, but may not be construed to exclude the existence of or a possibility of addition of one or more other characteristics, numbers, steps, operations, constituent elements, or combinations thereof.

Unless defined otherwise, all terms used herein including technical or scientific terms have the same meanings as those generally understood by those of ordinary skill in the art to which the present inventive concept may pertain. The terms as those defined in generally used dictionaries are construed to have meanings matching that in the context of related technology and, unless clearly defined otherwise, are not construed to be ideally or excessively formal.

As used herein, the term "and/or" includes any and all combinations of one or more of the associated listed items. Expressions such as "at least one of," when preceding a list of elements, modify the entire list of elements and do not modify the individual elements of the list.

It will be understood that, although the terms first, second, third etc. may be used herein to describe various elements, these elements should not be limited by these terms. Unless indicated otherwise, these elements are used to distinguish one element from another. For example, a first element discussed below could be termed a second element without departing from the teachings of the present inventive concept. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

As used herein, the singular forms "a," "an" and "the" are intended to include the plural forms as well, unless the context clearly indicates otherwise.

In an embodiment of the present inventive concept, a three-dimensional (3D) memory array is provided. The 3D memory array is monolithically formed in one or more physical levels of arrays of memory cells having an active area disposed above a silicon substrate and circuitry associated with the operation of those memory cells, whether such associated circuitry is above or within such substrate. The term "monolithic" means that layers of each level of the array are directly deposited on the layers of each underlying level of the array.

In an embodiment of the present inventive concept, the 3D memory array includes vertical NAND strings that are vertically oriented such that at least one memory cell is located over another memory cell. The at least one memory cell may comprise a charge trap layer.

The following patent documents, which are hereby incorporated by reference, describe suitable configurations for three-dimensional memory arrays, in which the three-dimensional memory array is configured as a plurality of levels, with word lines and/or bit lines shared between levels: U.S. Pat. Nos. 7,679,133; 8,553,466; 8,654,587; 8,559,235; and US Pat. Pub. No. 2011/0233648.

FIG. 1 is a block diagram of an electronic device 100 according to an exemplary embodiment.

Referring to FIG. 1, the electronic device 100 may include one or more devices. FIG. 1 illustrates the electronic device 100 which includes a first device 120 and a second device 140. As used herein, a device may refer to various items such as a semiconductor device, a semiconductor chip, a memory chip, a logic chip, a package, or combinations thereof. A semiconductor device such as a semiconductor chip, a memory chip, or a logic chip may be formed from a wafer. A device may include one or more chips stacked on a package substrate, or a package-on-package device including a plurality of packages. An electronic device, as used herein, may refer to one of these devices and may also include products that include these devices, such as a memory module, a hard drive including additional components, a mobile phone, laptop, tablet, desktop, camera, server, or other consumer electronic device, etc.

The first device 120 may include a central processing unit (CPU) 122 and a memory interface 124, which are connected to a bus 126. The CPU 122 controls execution of an application requested by a user. The memory interface 124 provides an interface to transmit or receive data needed for executing the application, which is requested by the CPU. A request, as used herein, may refer to an application for processing data from/to a predetermined area of a memory.

Figure 2:
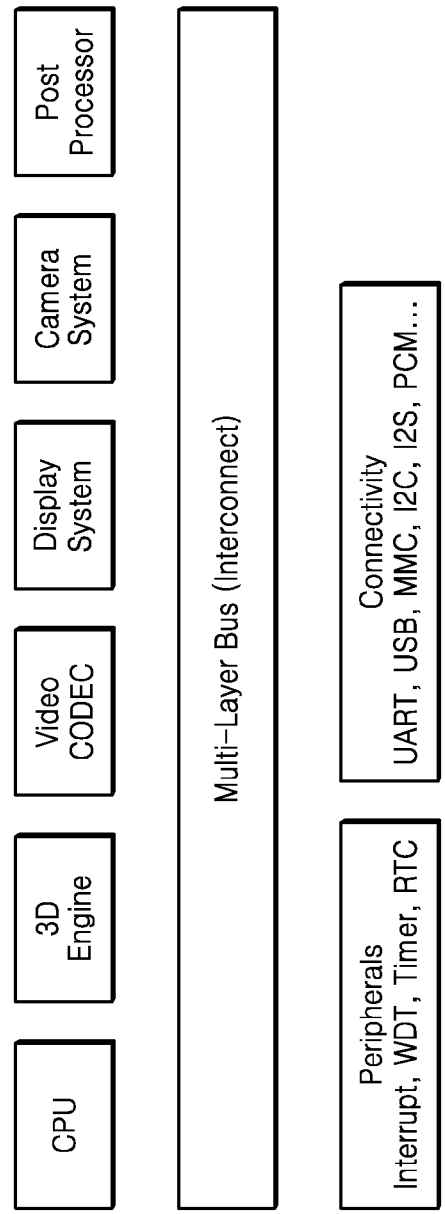
FIG. 2 is a block diagram illustrating an example of a first device of FIG. 1.

The first device 120 may include various Intellectual Properties (IPs) as illustrated in FIG. 2, in addition to the CPU 122 and the memory interface 124 connected to the bus 126. For example, the first device 120 may be an application processor (AP) including a 3 dimensional (3D) engine, video codec, a display system, a camera system, a post processor, and a peripheral or connectivity, which are connected to the bus 126 ("interconnector"). One of the IPs of FIG. 2, like the CPU 122, may request transmission or receiving of data through the memory interface 124 to execute an application. However, for convenience of explanation, the following description is of an example of the CPU 122 of FIG. 1 requesting transmission or receiving of data.

Referring back to FIG. 1, the memory interface 124 communicates with the CPU 122 via the bus 126. For example, when a protocol of the bus 126 is advanced microcontroller bus architecture (AMBA), in a READ transaction of the CPU 122, the memory interface 124 transmits data corresponding to an address as HRDATA to the CPU 122, and in a WRITE transaction of the CPU 122, the memory interface 124 stores the data corresponding to the address as HWDATA in a register (not shown) included in the memory interface 124. The address is transmitted via the bus 126 in an address phase and the data is transmitted via the bus 126 in a data phase.

FIGS. 3A and 3B are diagrams illustrating examples of the address and data transmitted via the bus 126 in the first device 120 of FIG. 1.

Referring to FIGS. 1, 3A, and 3B, the CPU 122 and the memory interface 124 transmit addresses A1, A2, and A3 via the bus 126 in the address phase and pieces of data D11~D14, D21~D23, and D31 respectively corresponding to addresses A1, A2, and A3 in the data phase. Processing of each of the addresses A1, A2, and A3 may be referred to as a transaction that is a work unit. Accordingly, each transaction may include at least one piece of data as illustrated in FIG. 3. Each of the pieces of data may be transmitted or received in units of data via the bus 126. For example, one piece of data D11 may be transmitted or received via the bus 126 during one cycle of a clock signal. Although FIGS. 3A and 3B illustrate that all pieces of data included in the same transaction are sequentially transmitted, for example, the data D13 of a transaction A1 may be transmitted when a certain number of clocks pass after the data D12 is transmitted through the bus 126.

As illustrated in FIG. 3A, after a preceding transaction is completed, a next transaction may be generated. For example, after all data D11~D14 included in the preceding transaction A1 are transmitted, the transactions A2 and A3 may be performed. Alternatively, according to an example of FIG. 3B, the transactions may be performed in out-of-order execution. For example, the transactions A2 and A3 may be performed before the transaction A1 is completed.

Referring back to FIG. 1, the data processed by the first device 120 according to the above operation may be transmitted by the memory interface 124 to the second device 140 via a communication channel 160. Alternatively, the data received from the second chip 140 via the memory interface 124 may be processed by the first device 120 according to the above operation. The communication channel 160 may be provided in a wired or wireless manner. Data may be transmitted or received in units of transactions between the first device 120 and the second device 140. The transaction unit may vary according to a transmission subject. For example, the amount of a transaction to be transmitted may differ from when the CPU 122 of FIG. 2 requests the second device 140 to process data and a post-processing processor (not shown) requests the second device 140 to process data.

The second device 140 is a memory system including a memory controller 142 including a scoreboard 144, a main memory 146 (e.g., a first memory), and a storage 148 (e.g., a second memory). The memory controller 142 processes a request from the first device 120. For example, the memory controller 142 controls data write to or data read from the main memory 146 and the storage 148. For example, the memory controller 142 may control an operation of loading (writing) the data stored in the storage 148, on the main memory 146, or storing the data loaded on the main memory 146 in the storage 148, which is requested by the first device 120. Also, the memory controller 142 may control an operation of writing the data received from the first device 120 to the main memory 146 or transmitting the data written to the main memory 146 to the first device 120.

The storage 148 may be non-volatile memory such as read only memory (ROM), a magnetic disc, an optical disc, flash memory, etc. The main memory 146 may be dynamic random access memory (DRAM) or static random access memory (SRAM). Additionally, the storage 148 or the main memory 146 may be embodied by magnetic random access memory (MRAM), resistance random access memory (RRAM), ferroelectric random access memory (FRAM), phase change memory (PCM), etc.

The memory controller 142 may use firmware to perform the above control operation. The firmware may be provided as software. Also, when the storage 148 is flash memory, a flash translation layer (FTL) may be used as firmware. The firmware may perform a management operation such as garbage collection, wear levelling, etc. to control the flash memory. In addition, the firmware may perform a conversion operation between a logical address transmitted from the first device 120 and a physical address of the storage 148. The memory controller 142 may include one or more register sets for storing information related to the above control. The firmware may be, for example, stored in the storage 148 such as flash memory and then loaded on the main memory 146 when the memory system 140 is turned on.

In one embodiment, the second device 140 may include one or more chips stacked on a semiconductor substrate. For example, each of the memory controller 142, the main memory 146, and the storage 148 may include one or more chips, or one or more chips stacked on a semiconductor substrate. In one embodiment, the second device 140 may include one or more packages or a package-on-package device including a plurality of packages. For example, a package may include one or more chips stacked on a package substrate.

Figure 4:
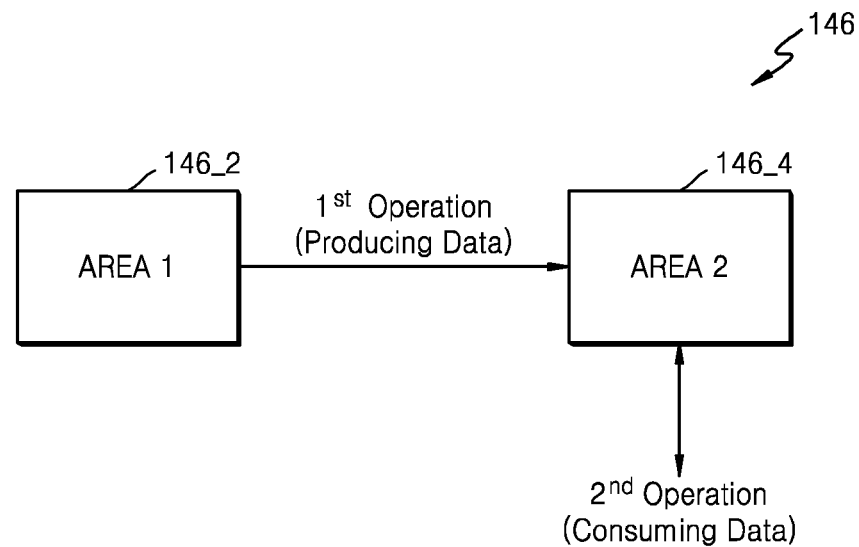
FIG. 4 is a block diagram for describing data movement in a main memory of FIG. 1 according to an exemplary embodiment.

FIG. 4 is a block diagram for describing data movement in the main memory 146 of FIG. 1 according to an exemplary embodiment.

Referring to FIGS. 1 and 4, in addition to the above control operation, the memory controller 142 may control an operation of copying data in a first area 146_2 of the main memory 146 to a second area 146_4 of the main memory 146. The first area 146_2 of the main memory 146 is an area assigned to, for example, an operating system and the second area 146_4 is an area assigned to, for example, the execution of an application. When a plurality of applications are executed in the electronic device 100, the second area 146_4 may be assigned to each of the applications. For example, when the data in the first area 146_2 is requested for the execution of an application, the data in the first area 146_2 may be copied to the second area 146_4. The application may perform an operation of using the data copied to the second area 146_4.

An operation of providing data, or producing data, like the operation of copying the data in the first area 146_2 to the second area 146_4, is referred to as a first operation unless described otherwise below. Also, an operation of using the data copied to the second area 146_4, or consuming data, is referred to as a second operation unless described otherwise below.

However, the present inventive concept is not limited thereto. When data is being provided from the first area to the second area, the data may be provided from a plurality of first areas to one second area. Also, when an operation of image operation or arithmetic operation is performed in addition to a copy operation, the first operation and the second operation may be performed together as described above. Although the memory controller 142 is described as performing a control operation in response to a request REQ of the first device 120, the present inventive concept is not limited thereto. In one embodiment, the memory controller 142 may perform the above-described control operation based on an internal request of the second device 140. For example, the memory controller 142 may perform the above-described control operation when performing, for example, the garbage collection or wear levelling of the storage 148 that is flash memory. Also, the second device 140 may further include a processor (not shown) to execute an application, in addition to the main memory 146 and the storage 148. For example, the second device 140 may perform the above-described control operation in response to a request REQ of the processor.

Figure 5:
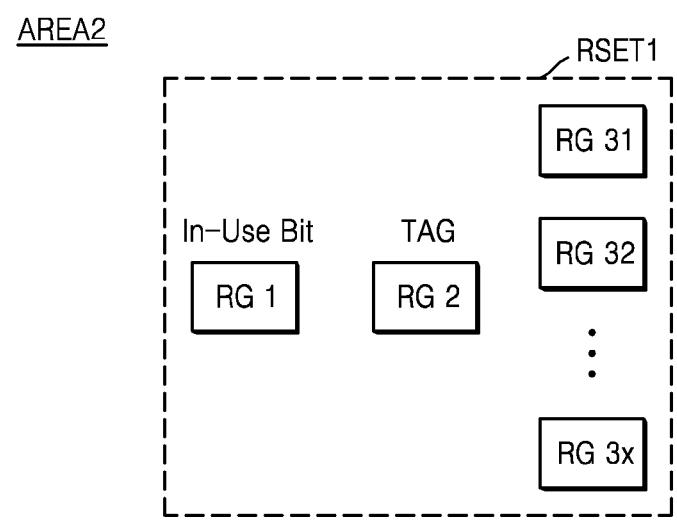
FIG. 5 is a block diagram for describing an operation of a scoreboard of FIG. 1 according to an exemplary embodiment.

FIG. 5 is a block diagram for describing an operation of the scoreboard 144 of FIG. 1 according to an exemplary embodiment.

Referring to FIGS. 1, 4, and 5, the scoreboard 144 stores information about a degree of progression of the first operation when the first operation is being performed. For example, the scoreboard 144 may store an in-use bit indicating whether the first operation is being performed in the second area 146_4, a tag TAG indicating a start address of the second area 146_4, and a plurality of full/empty bits respectively indicating whether the first operation is completed for each sub-area of the second area 146_4, for example, whether each sub-data has been provided to a corresponding sub-area of the second area 146_4. Data that is divided into each sub-area may be referred to as sub-data. The scoreboard 144 may include a plurality of registers to store the above information. For example, the scoreboard 144 may include a first register RG1 for storing the in-use bit, a second register RG2 for storing the tag, and third registers RG31, RG32, . . . , and RG3x for storing each of the full/empty bits. For example, for the single second area 146_4, one register set RSET1 including the first register RG1 to the third registers RG31, RG32, . . . , and RG3x may be assigned to the scoreboard 144.

In one embodiment, each size of respective the first register RG1 to the third registers RG31, RG32, . . . , and RG3x may vary according to the contents to be stored. For example, when the first operation is being performed in the second area 146_4, the in-use bit is stored with a logic value "1". For the opposite case, a logic value "0" is stored. For example, the first register RG1 for storing the in-use bit may be provided with a size of 1 bit. For example, when the second area 146_4 is an area that starts from an address "0100", the tag may be stored with the address value "0100". Thus, the second register RG2 for storing the tag may be provided in a size of 4 bits. For example, when the second area 146_4 may be divided into 12 sub-areas, the third registers RG31, RG32, . . . , and RG3x may be provided as twelve (12) registers. When the provision of data to any one of the sub-areas of the second area 146_4 is completed, a logic value "1" is stored in a corresponding register of the third registers RG31, RG32, . . . , and RG3x and a logic value "0" may be stored in the opposite case. For example, each of the twelve (12) third registers RG31, RG32, . . . , and RG3x may be embodied in a size of 1 bit.

Figure 6:
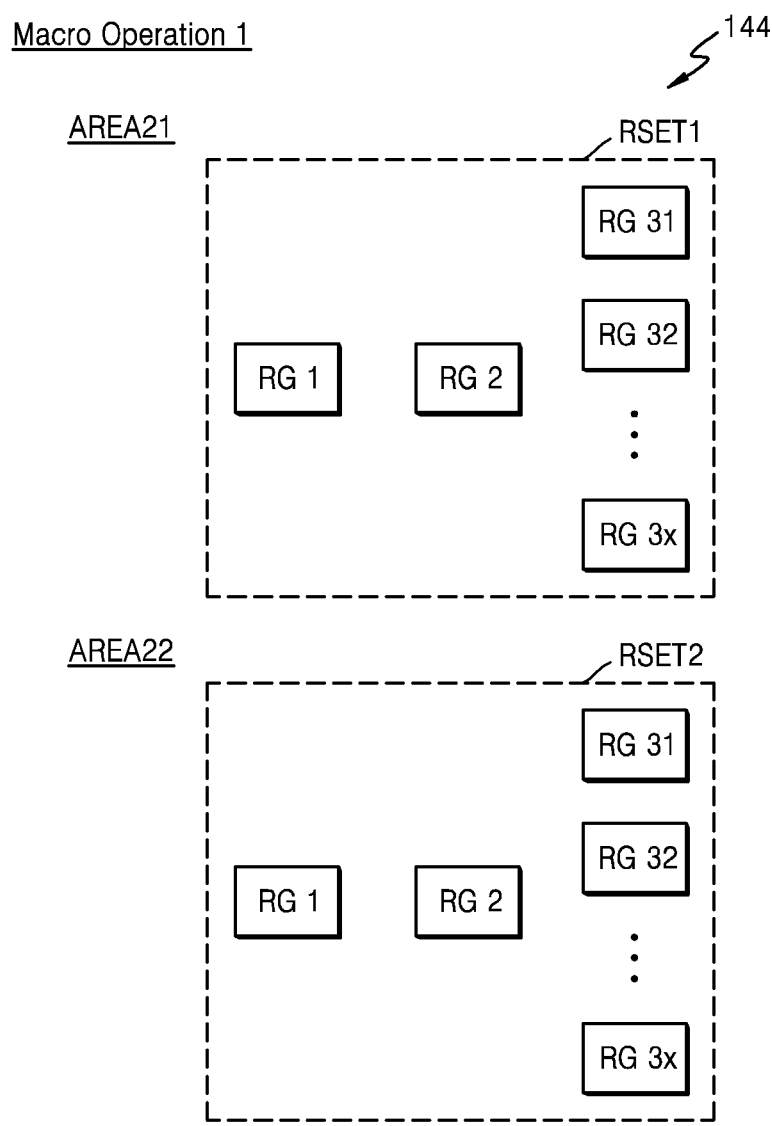
FIGS. 6, 7, and 8 are block diagrams illustrating exemplary embodiments of the scoreboard of FIG. 1.

FIG. 6 illustrates an exemplary embodiment of the scoreboard 144 of FIG. 1.

Referring to FIGS. 1, 4, and 6, the second area 146_4 may be set to a size corresponding to execution of a macro operation. The request from the first device 120 may be received in units of macro operations or may be processed by the memory controller 142 of the second device 140 in the units of macro operations. For example, one macro operation may include at least two relevant micro operations. The macro operation may correspond to the second operation of consuming the data provided to the second area 146_4. For example, a plurality of write operations (e.g., micro operations) corresponding to consecutive addresses may be processed with one macro operation. For example, when the macro operation is an operation of processing data of 48 Kbytes, the second area 146_4 may be set to be 48 Kbytes.

In one embodiment, the scoreboard 144 may indicate a degree of progression of the first operation in the second area 146_4 of 48 Kbytes. For example, if one sub-area has 64 Bytes then the second area 146_4 may be divided in 750 sub-areas and may include 750 third registers RG31, RG32, ..., and RG3x. For example, each of the 750 third registers RG31, RG32, ..., and RG3x may store a full/empty bit that indicates whether the provision of data to each of 750 sub-areas, each having a size of 64 Bytes of the second area 146_4, is completed. For example, when the provision of data to the second sub-area of the second area 146_4 is completed, the logic value "1" is stored in the third registers RG31 and RG32 of the third registers RG31, RG32, ..., and RG3x and the logic value "0" may be stored in the other third registers RG33, RG34, ..., and RG3x.

In one embodiment, in performing a macro operation, a desired size of the second area 146_4 may vary. For example, the scoreboard 144 of FIG. 6 may indicate whether the first operation is being performed in second areas AREA21 and AREA22, each corresponding to a size of 48-Kbyte. For example, when a first macro operation is an operation that requires the provision of 96-Kbyte data, to perform the first macro operation, the scoreboard 144 may assign two sets of registers RSET1 and REST2 respectively corresponding to the second areas AREA21 and AREA22.

FIG. 6 illustrates an embodiment in which each register set of the scoreboard 144 has the same structure. For example, x number of third registers RG31, RG32, ..., and RG3x are provided for the second area AREA21, and likewise, x number of third registers RG31, RG32, ..., and RG3x are provided for the second area AREA22. As described above, each of the third registers RG31, RG32, ..., and RG3x for the second area AREA21 and the third registers RG31, RG32, ..., and RG3x for the second area AREA22 identically indicates providing data in units of 64 Bytes.

Figure 7:
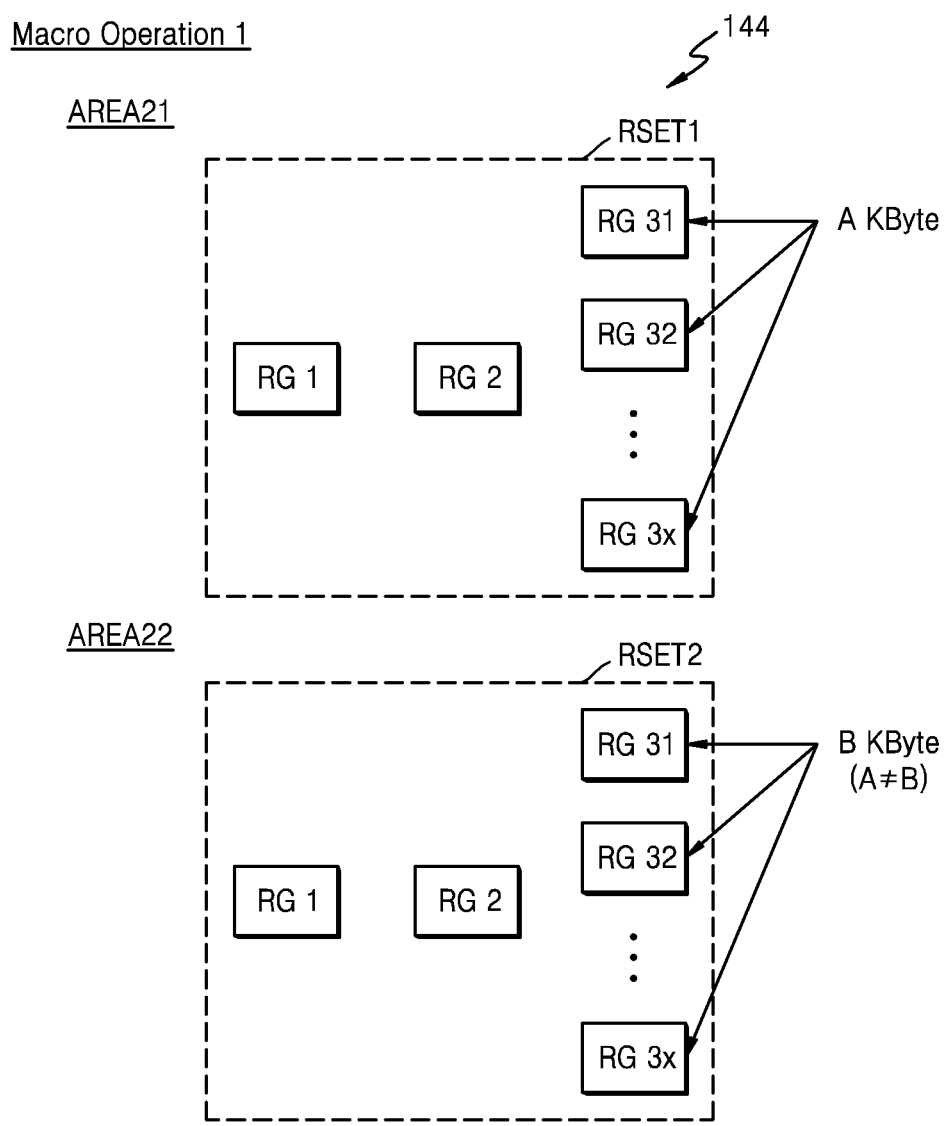

FIG. 7 illustrates another exemplary embodiment of the scoreboard 144 of FIG. 1.

Referring to FIG. 7, the third registers RG31, RG32, ..., and RG3x of a first register set REST1 for the second area AREA21 and the third registers RG31, RG32, ..., and RG3x of a second register set REST2 for the second area AREA22 are provided in the same number "x", where x is a positive integer greater than or equal to 2, but may store information (full/empty bit) about the provision of data in different units. For example, while each of third registers RG31, RG32, ..., and RG3x of the first register set REST1 of the scoreboard 144 for the second area AREA21 indicates whether to provide data in units of 64 Bytes, each of third registers RG31, RG32, ..., and RG3x of the second register set REST2 of the scoreboard 144 for the second area AREA22 may indicate whether to provide data in a unit different from the units of 64 Bytes of the first register set REST1.

In one embodiment, the memory controller 142 may set the second area 146_4 corresponding to the size of data needed for the second operation and a register set of the scoreboard 144 for the set second area 146_4. For example, the memory controller 142 may set the data to be provided to the second area AREA21 for the first macro operation that is the second operation requiring the provision of 48-Kbyte data, and may set the first register set RSET1 of the scoreboard 144, which indicates including seven hundred and fifty (750) third registers RG31, RG32, ..., and RG3x and whether to provide data in units of 64 Bytes, to correspond to the second area AREA21. Also, the memory controller 142 may set the data to be provided to the second area AREA22 for the first macro operation that is the second operation requiring the provision of 96-Kbyte data and may set the second register set RSET2 of the scoreboard 144, which indicates including seven hundred and fifty (750) third registers RG31, RG32, ..., and RG3x and whether to provide data in a unit different from the unit of 64 Bytes (e.g., 128 Bytes), to correspond to the second area AREA22.

Figure 8:
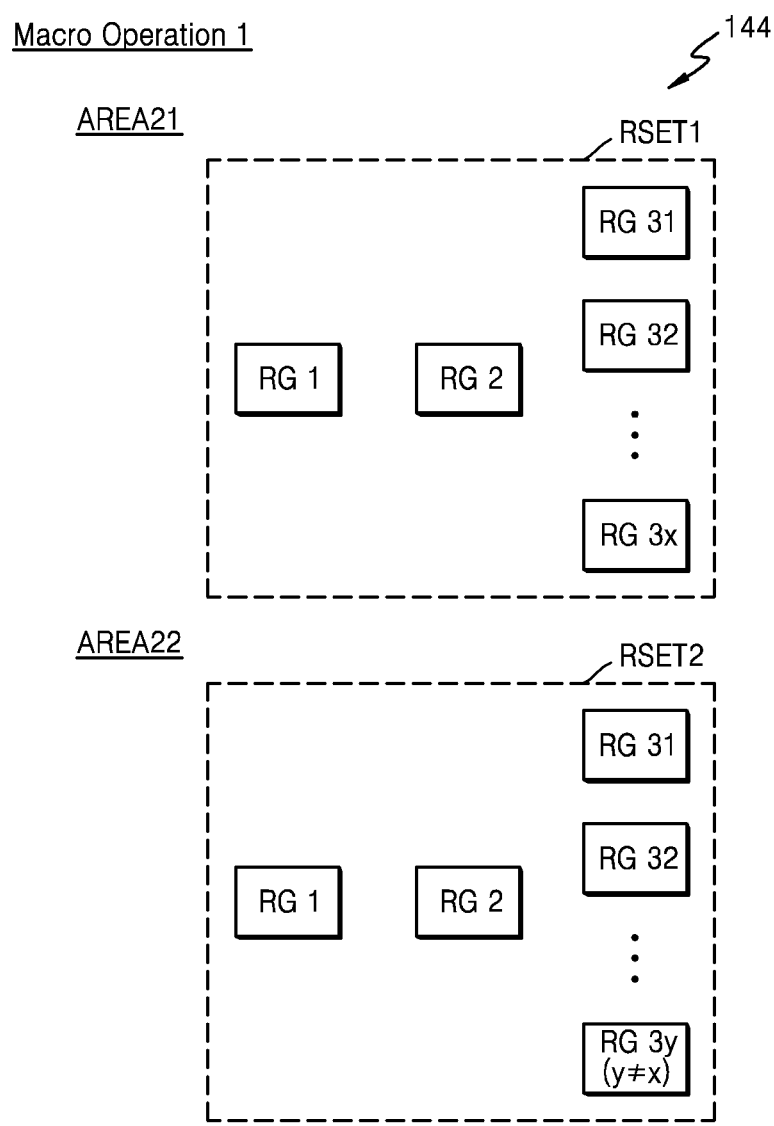

FIG. 8 illustrates still another exemplary embodiment of the scoreboard 144 of FIG. 1.

Referring to FIG. 8, the third registers RG31, RG32, ..., and RG3x of the first register set RSET1 for the second area AREA21, and the third registers RG31, RG32, ..., and RG3y of the second register set RSET2 for the second area AREA22, are provided in different numbers. For example, x number of third registers RG31, RG32, ..., and RG3x may be provided in the first register set RSET1 and y number of third registers RG31, RG32, ..., and RG3y, where y≠x, y is a positive integer greater than or equal to 2, may be provided in the second register set RSET2. For example, compared to the above-described embodiment, the memory controller 142 may set the data to be provided to the second area AREA21 for the first macro operation that is the second operation requiring the provision of 48-Kbyte data, and may set the first register set RSET1 of the scoreboard 144, which indicates including seven hundred and fifty (750) third registers RG31, RG32, ..., and RG3x and whether to provide data in the units of 64 Bytes, to correspond to the second area AREA21. Also, the memory controller 142 may set the data to be provided to the second area AREA22 for the first macro operation that is the second operation requiring the provision of 96-Kbyte data and may set the second register set RSET2 of the scoreboard 144, which indicates including one thousand and five hundred (1500) third registers RG31, RG32, ..., and RG3y and whether to provide data in units of 64 Bytes, to correspond to the second area AREA22.

Furthermore, when each register set is set to correspond to data (size of the second area) having a larger size than the size of the data needed for the second operation, some of the third registers of the register set may be set to have a null value. As described above, according to an exemplary embodiment of the present inventive concept, the register set of the scoreboard 144 may be set to be optimal for the execution of the second operation. As described above, the above control may be performed by changing the physical structure of the register set of the scoreboard 144 or by changing the control of the memory controller 142 without changing the structure thereof. The former may be referred to as hardware control and the latter may be referred to as software control. In the latter case, the memory controller 142 may differently set the size of a sub-area indicated by the third register of the register set according to the size of the desired data.

Although in the above description the scoreboard 144 indicates whether to perform the first operation with the information stored in the register set that is hardware, the present inventive concept is not limited thereto. The scoreboard 144 may be embodied by a table in which each of the second areas is used as an index and the tag, the in-use bit, and the full/empty bit for each second area are used as entry. Also, although FIG. 1 illustrates that the scoreboard 144 is located inside the memory controller 142, the present inventive concept is not limited thereto and the scoreboard 144 may be located outside the memory controller 142.

Figure 9:
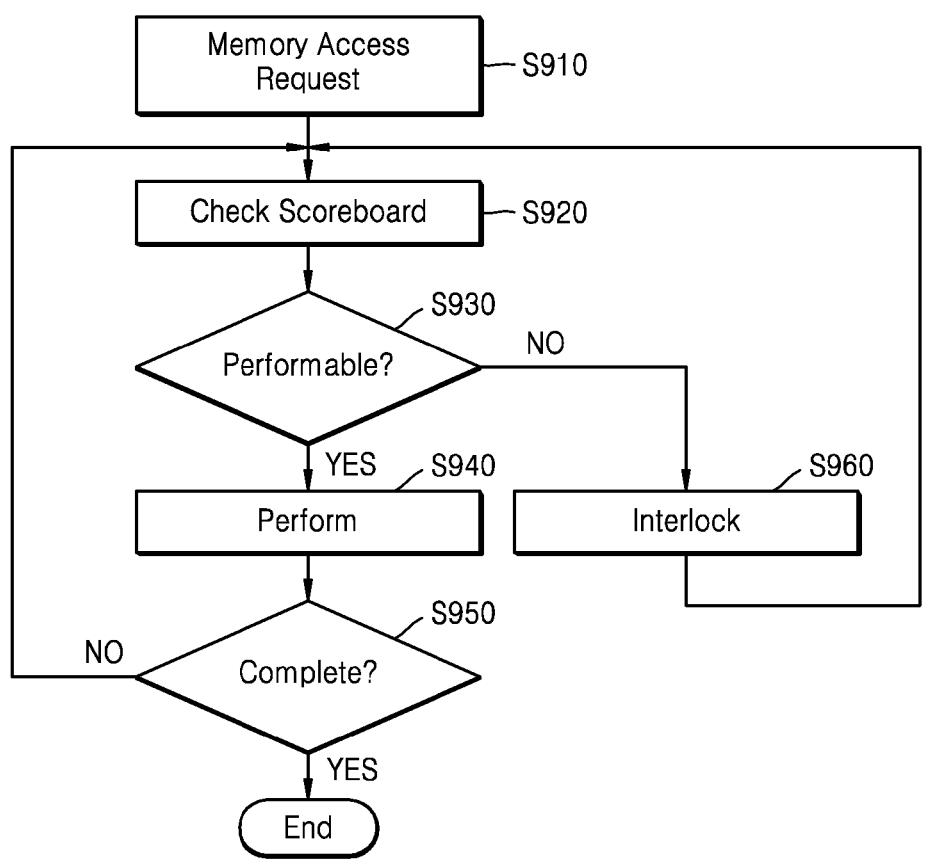
FIG. 9 is a flowchart for explaining a method of operating a memory system according to an exemplary embodiment.

FIG. 9 is a flowchart for explaining a method of operating a memory system, according to an exemplary embodiment. As described above, the second device 140 of FIG. 1 is a memory system. In the following description, the memory system is set forth to be the second chip 140. Referring to FIGS. 1, 4, 6, and 9, the memory controller 142 of the second device 140 receives a memory access request from the first device 120 (S910). The memory access request may be a read command on data of the main memory 146 or the storage 148. Alternatively, the memory access request may be a write command on the storage 148 or on the main memory 146 or a request for the execution of the first operation in the main memory 146.

As described above, the request transmitted by the first device 120 may be in units of macro operations, and when the memory access request is received, the memory controller 142 communicating with the first device 120 checks the scoreboard 144 (S920). For example, while a copy operation is being performed based on the memory access request from the first area 146_2 of the main memory 146 to the second area 146_4 of FIG. 4, the memory controller 142 checks whether the second operation requested by the memory access request is completely or partially performable, by referring to the third registers RG31, RG32, . . . , and RG3x of the first register set RSET1 of the scoreboard 144 of FIG. 6 (S930). Whether the second operation is completely or partially performable is determined based on whether the data needed for completely or partially performing the second operation has been provided or copied to the second area 146_4.

Whether the second operation is completely or partially performable may be checked in units of the third registers RG31, RG32, . . . , and RG3x. For example, when the 48-Kbyte data of the first area 146_2 of the main memory 146 is needed to be copied to the second area 146_4 in order to perform the second operation, and each of the third registers RG31, RG32, . . . , and RG3x of the first register set RSET1 indicates that data is copied in units of 64 Bytes, an operation of checking the scoreboard 144 (S920) may be checked in units of 64 Bytes about progression of the second operation. An example of the above operations will be described in detail below.

If the second operation is completely or partially performable (YES of S930), a performable part of the second operation is performed (S940). When the second operation is not completed (NO of S950), the scoreboard 144 is checked again (S920) and whether the other part of the second operation is performable is checked (S930). If no part of the second operation is performable (NO of S930), interlock of the second operation is instructed (S960). Then, the scoreboard 144 is checked again (S920) and the procedure is held off until the whole or part of the second operation is performable (YES of S930). If the second operation is completed (YES of S950), the register set of the scoreboard 144 may be reset.

Figure 10:
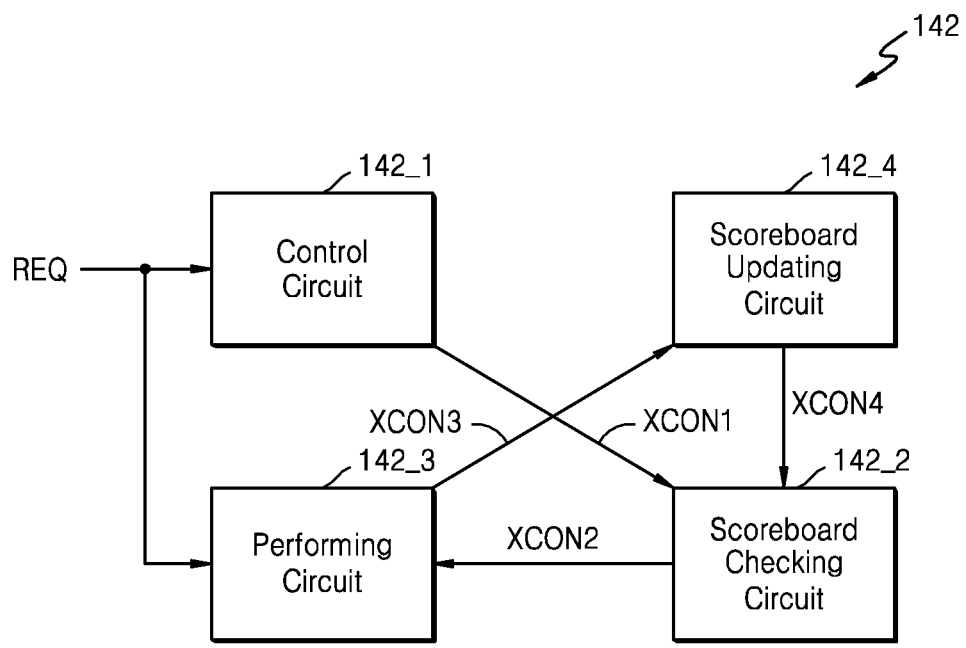
FIGS. 10 and 11 are block diagrams illustrating an example of the memory controller of FIG. 1 according to exemplary embodiments.

FIG. 10 is a block diagram of an example of the memory controller 142 of FIG. 1 according to an exemplary embodiment.

Referring to FIG. 10, the memory controller 142 may include a control circuit 142_1, a scoreboard checking circuit 142_2, a performing circuit 142_3, and a scoreboard updating circuit 142_4. The control circuit 142_1 receives a request REQ from the first device 120 and, to process the request REQ, generates a first control signal XCON1 to control the performing circuit 142_3, the scoreboard checking circuit 142_2, and the scoreboard updating circuit 142_4. However, for convenience of explanation, the first control signal XCON1 is transmitted to the scoreboard checking circuit 142_2, as illustrated in FIG. 10. As described above, the request REQ from the first device 120 may be received or processed in units of macro operations.

The scoreboard checking circuit 142_2, in response to the first control signal XCON1, may check a degree of copying from the first area 146_2 to the second area 146_4 in the main memory 146. The scoreboard checking circuit 142_2, in response to the first control signal XCON1, may check a degree of copying data from the first area 146_2 to the second area 146_4 in the main memory 146 and may generate a second control signal XCON2. For example, whether a register set of the second area 146_4 is prepared is checked by checking a tag value of the second register RG2 of the register set RSET1 of FIG. 6. Whether the copy operation to the second area 146_4 is being performed is checked by checking an in-use bit value of the first register (RG1). It may be checked whether the data has been provided up to which part of the sub-area of the second area 146_4 by checking full/empty bit values of the third registers RG31, RG32, . . . , and RG3x. For example, while a copy operation is being performed with respect to an address "0100" of the second area 146_4, the scoreboard checking circuit 142_2 may generate the second control signal XCON2 indicating whether data requiring the second operation to be performed by the performing circuit 142_3 is copied to the second area and transmit the generated second control signal XCON2 to the performing circuit 142_3.

For example, to perform the second operation requested for execution of an application from the first device 120, the performing circuit 142_3 may perform the request REQ to the sub-data that is completely transmitted to the second area and then may generate a third control signal XCON3 that is information about a result thereof and transmit the third control signal XCON3 to the scoreboard updating circuit 142_4. In addition, the performing circuit 142_3 performs the request REQ received from the first device 120 in response to the second control signal XCON2. For example, when processing of the data stored in the storage 148 is requested from the first device 120, the control circuit 142_1 may transmit information about mapping a logic address received from the first device 120 with a physical address of the storage 148, as the first control signal XCON1, to the performing circuit 142_3. The performing circuit 142_3, in response to the first control signal XCON1, may load the data stored in the physical address on the main memory 146 or transmit the data to the first device 120. In addition, the performing circuit 142_3 may perform transmission of data from the first area to the second area and generate the third control signal XCON3 based on a result of the transmission of data.

The scoreboard updating circuit 142_4, in response to the third control signal XCON3, updates the information stored in the register set REST1 of the scoreboard 144. For example, the scoreboard updating circuit 142_4 stores information about a degree at which the performing circuit 142_3 in the register set RSET1 copies data to the second area 146_4. For example, when the third register RG31 of FIG. 6 has a logic value "1" and the third register RG32 has a logic value "0", and then the performing circuit 142_3 additionally copies 64 Bytes to the second area 146_4, the scoreboard updating circuit 142_4 updates a logic value of the third register RG32 to "1".

The scoreboard updating circuit 142_4 may generate a fourth control signal that is a result of the update and transmit the fourth control signal to the scoreboard checking circuit 142_2. Unlike as described with reference to FIG. 10, the control circuit 142_1, the performing circuit 142_3, the scoreboard checking circuit 142_2, and the scoreboard updating circuit 142_4 may transmit or receive the first control signal XCON1, the second control signal XCON2, the third control signal XCON3, and a fourth control signal XCON4, respectively.

Figure 11:
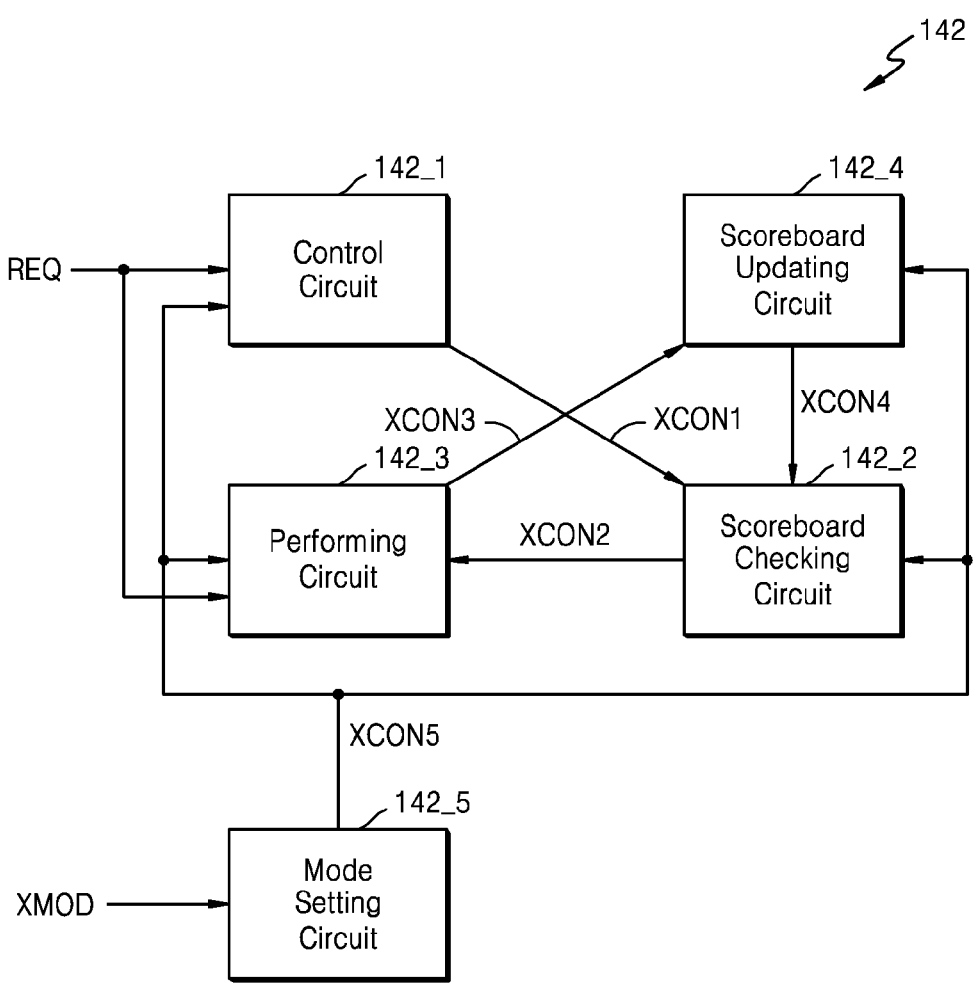

FIG. 11 is a block diagram of a memory controller 142 according to another exemplary embodiment.

Referring to FIG. 11, the memory controller 142 may include the control circuit 142_1, the performing circuit 142_3, the scoreboard checking circuit 142_2, and the scoreboard updating circuit 142_4 which constitute the memory controller 142 of FIG. 10. The operations of the control circuit 142_1, the performing circuit 142_3, the scoreboard checking circuit 142_2, and the scoreboard updating circuit 142_4 of FIG. 11 are the same as those of the circuits illustrated in FIG. 10. In one embodiment, the memory controller 142 of FIG. 11 further includes a mode setting circuit 142_5. The mode setting circuit 142_5 may receive a mode signal XMOD and generate a fifth control signal XCON5. When the mode signal XMOD has a first value, the mode setting circuit 142_5 may control the memory controller 142 of FIG. 11 to operate in the same manner as that described with reference to FIG. 10. For example, as illustrated in FIG. 10, in the first mode, the second operation may be controlled to be performed for each predetermined circuit without waiting for the completion of the first operation. In one embodiment, when the mode signal XMOD has a second value, the mode setting circuit 142_5 may control the memory controller 142 of FIG. 11 to operate in the second mode in which the second operation is being performed after the first operation is completed. The mode signal XMOD may be transmitted from the first device 120 or may be generated from the second device 140 as a result of monitoring an operational environment of the second device 140. The mode setting circuit 142_5, in response to the mode signal XMOD, may control activation of the scoreboard checking circuit 142_2 and the scoreboard updating circuit 142_4, or the control circuit 142_1 and the performing circuit 142_3 may control whether to perform the operation of the first mode.

Although FIGS. 10 and 11 do not illustrate the scoreboard 144, this is merely for convenience of explanation in describing the processing of the request REQ. The performing circuit 142_3, the scoreboard checking circuit 142_2, and the scoreboard updating circuit 142_4 are electrically connected to the scoreboard 144 and perform the above-described operations. For example, the scoreboard 144 may include the scoreboard checking circuit 142_2, and the scoreboard updating circuit 142_4.

Figure 12:
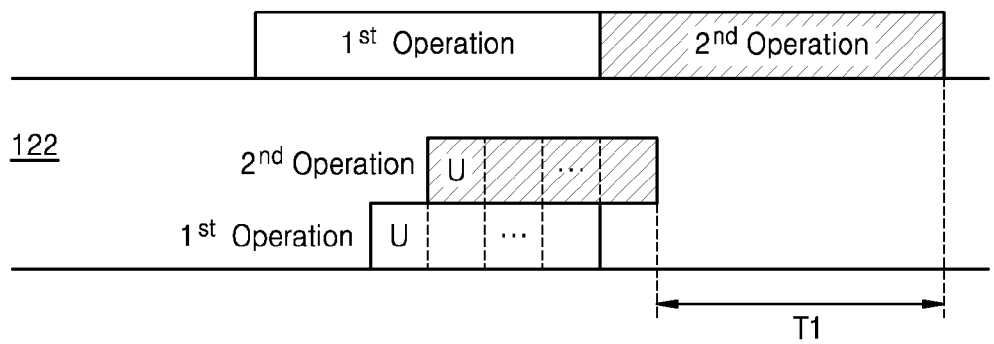
FIGS. 12 to 14 illustrate examples of an operation time in an electronic device or a memory system, according to exemplary embodiments.
Figure 13:
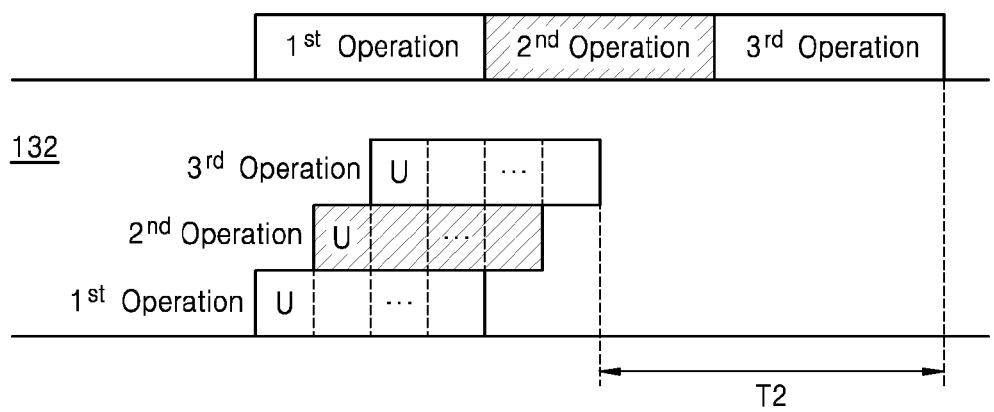
Figure 14:
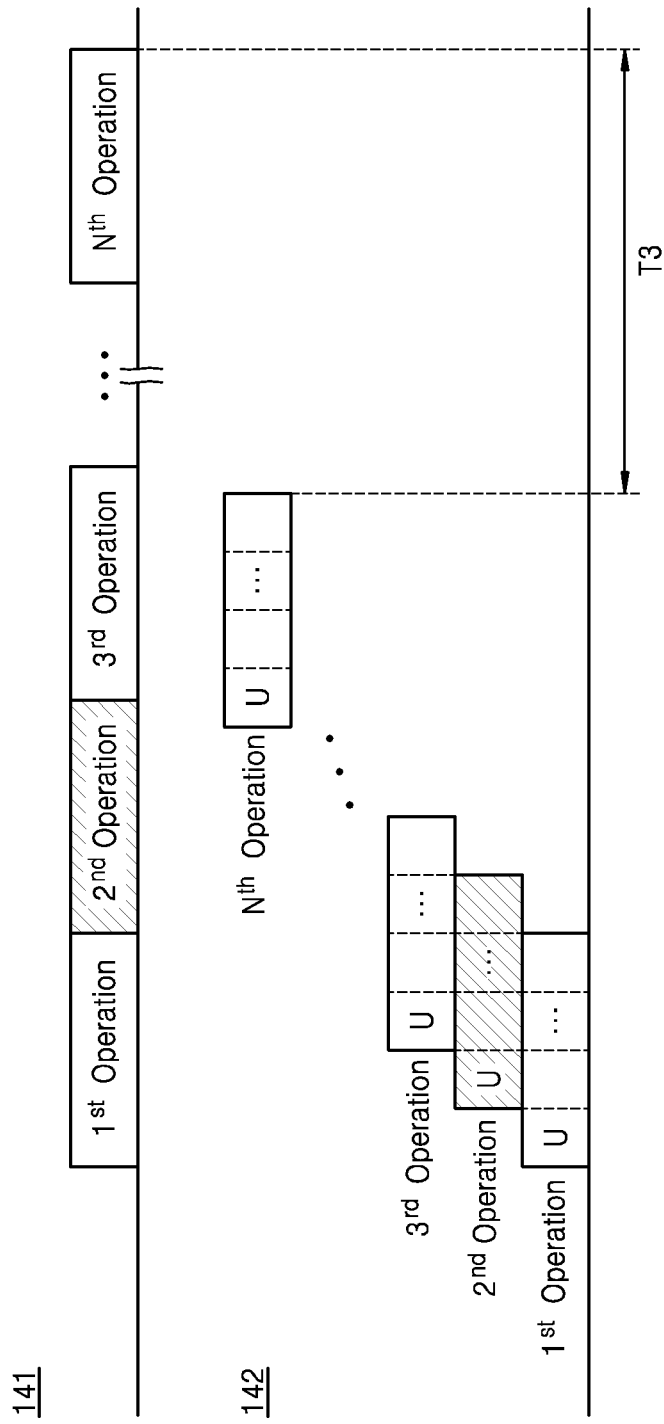

FIGS. 12 to 14 respectively illustrates examples of an operation time in an electronic device or a memory system, according to exemplary embodiments.

Referring to FIG. 12, when the second operation is performed while the first operation is being performed in a first unit (e.g., a first circuit) U (122), the operation time may be reduced by T1 compared to a case in which the second operation is performed in series after the first operation is completed (121). The first unit U may be a unit indicated by the third registers RG31, RG32, . . . , and RG3x of FIG. 6. In one embodiment, a plurality of set of sub-data may provide to the second area. Each of the plurality of set of sub-data may include a plurality of sub-data. For example, when providing of a first sub-data of a first set of sub-data to the second area is completed before providing of other sub-data of the first set of sub-data is completed, the second operation may be performed. As such, when the operation time decreases, a response speed of the electronic device or the memory system may be increased and thus a user may be provided with a better function. Response characteristics in a situation in such as particular I/O that may be sensed by a user may be greatly increased. As the operation time decreases, power consumption of the electronic device or the memory system may be prevented and resources may be assigned to other operations. Furthermore, in the electronic device or the memory system according to exemplary embodiments of the present inventive concept, as the memory controller performs the function of the main memory in a device, a bandwidth required for memory access may be reduced.

Referring to FIG. 13, the electronic device or the memory system according to exemplary embodiments of the present inventive concept may perform a third operation which may be performed by receiving data from the second operation. In one embodiment, while the second operation is being performed by providing data the third operation may be performed by consuming the provided data. For example, the electronic device or the memory system may perform the second operation using the result of the first operation on a first sub-area of the second area while the first operation is being performed on the other sub-areas of the second area. When a second application uses a result of the performance of a first application, an operation involved in the execution of the first application may be the second operation and an operation involved in the execution of the second application may be the third operation. When the second operation is directly performed while the first operation is being performed in a second unit (e.g., a second circuit) U (132) and the third operation is performed while the second operation is being performed in the second unit U as in the electronic device or the memory system according to an exemplary embodiment, the operation time may be reduced by T2, compared to a case in which the second operation is performed in series after the first operation is completed and the third operation is performed in series after the second operation is completed (131).

Like the method of FIG. 13, in the electronic device or the memory system according to an exemplary embodiment of the present inventive concept, more operations regarding the provision and consumption of data may be processed in parallel (pipeline) as illustrated in FIG. 14. For example, while garbage collection is being performed by a storage with the above-described first to third operations, the performing of four (4) or more operations may be requested. For example, the operation time thereof may be reduced by T3, compared to the time consumed to perform each of a plurality of operations.

Figure 15:
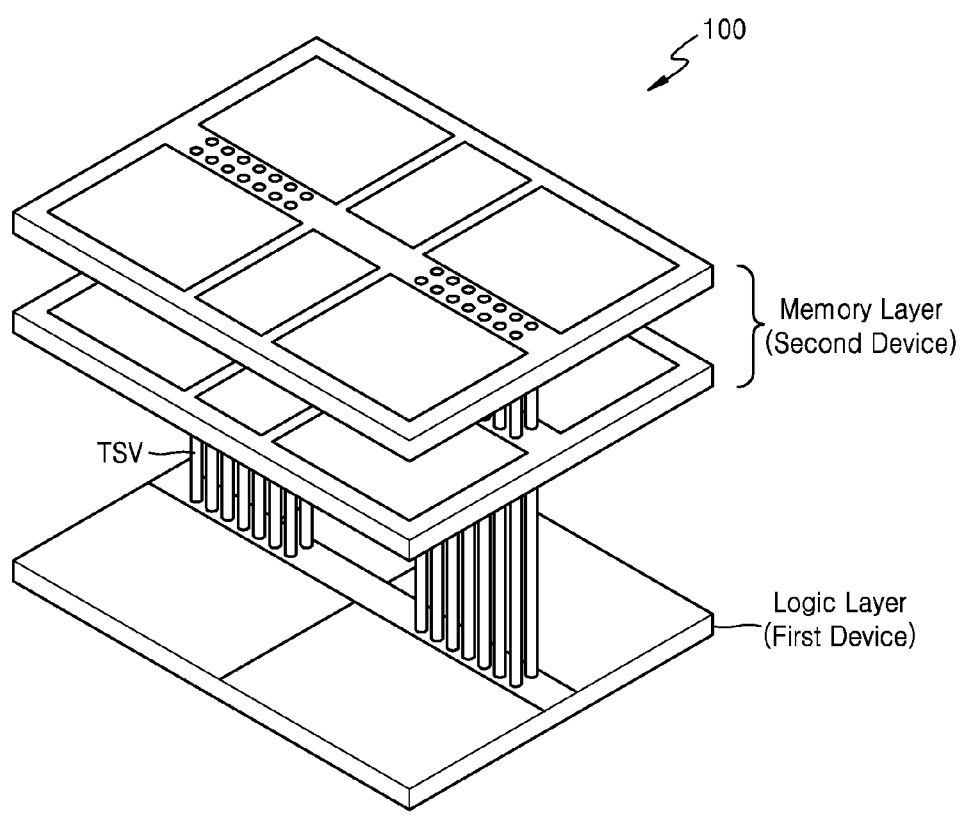
FIG. 15 is a perspective view illustrating an electronic device according to another exemplary embodiment.

FIG. 15 is a perspective view illustrating an electronic device 100 according to another exemplary embodiment.

Referring to FIG. 15, the electronic device 100 may include a logic layer and a memory layer. The logic layer may be the first device 120 of FIG. 1. The memory layer may be the second device 140 of FIG. 1. The memory layer may include a plurality of layers. For example, each layer of the memory layer may correspond to one of the second device 140 of FIG. 1. Alternatively, at least one of the layers of the memory layer may be embodied by the second device 140 of FIG. 1. Signals may be transmitted or received between the layers of FIG. 15 through a through substrate via (e.g., through silicon via TSV). For example, the TSV connecting the logic layer and the memory layer of FIG. 15 may be a channel connecting between the first chip 120 and the second device 140 of FIG. 1.

Figure 16:
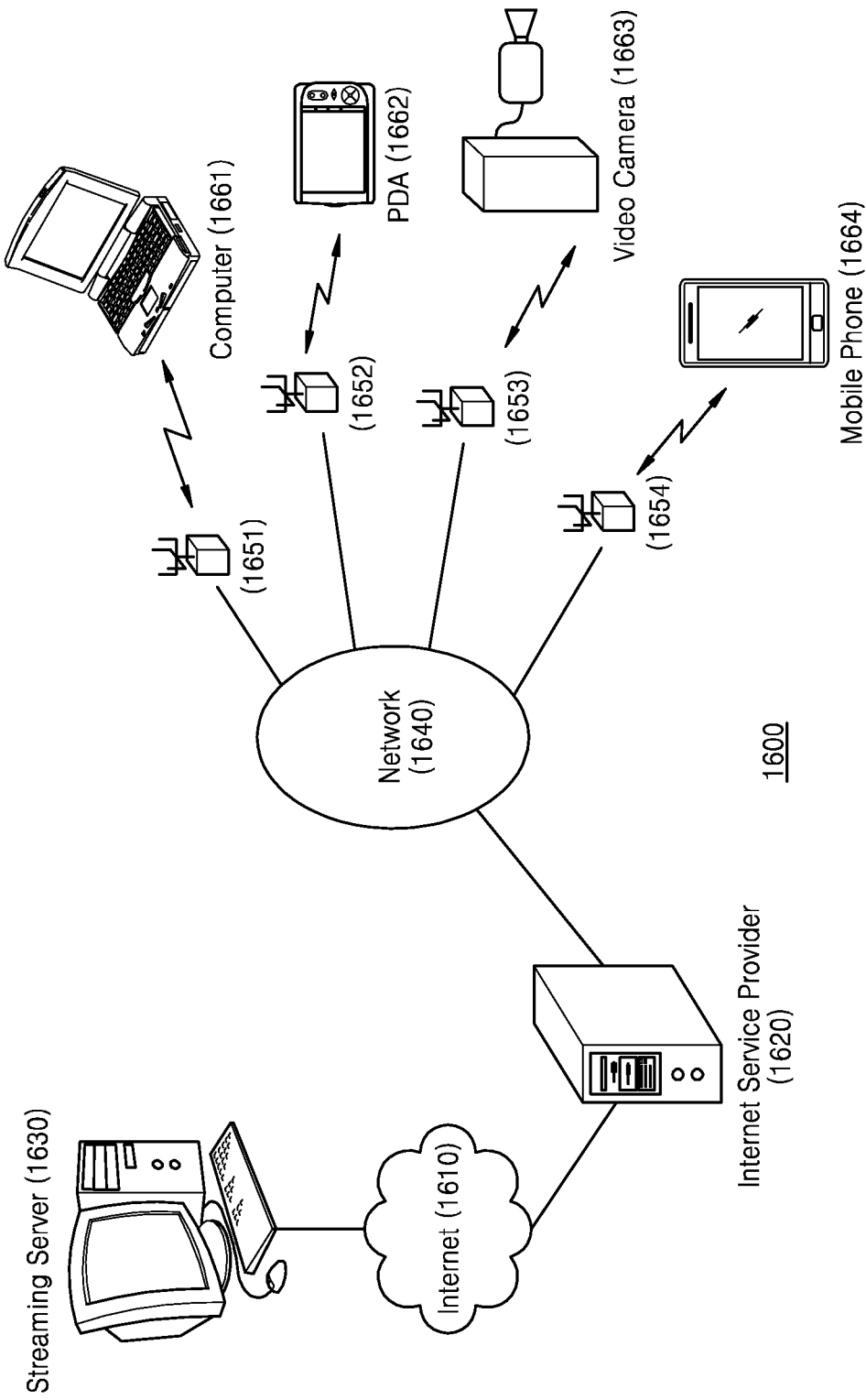
FIG. 16 illustrates a contents transmitting/receiving system in which a plurality of devices transmit/receive contents via a communication network.

FIG. 16 illustrates a content transmitting/receiving system 1600 in which a plurality of devices transmit/receive content via a communication network. The content transmitting/receiving system 1600 may include a plurality of independent devices. For example, independent devices such as a computer 1661, a personal digital assistant (PDA) 1662, a video camera 1663, a mobile phone 1664, etc. are connected to the Internet 1610 via an Internet service provider 1620, a network 1640, and wireless stations 1651~1654. A streaming server 1630 may provide the content to the plurality of independent devices. A memory system according to certain embodiments disclosed above may be provided in each of the independent devices of the content transmitting/receiving system 1600. For example, each of the independent devices such as the computer 1661, the PDA 1662, the video camera 1663, the mobile phone 1664, etc. may include the memory system that is embodied by the second device 140 of FIG. 1.

The configuration of the content transmitting/receiving system 1600 is not limited to the configuration illustrated in FIG. 16 and an independent device may be selectively connected to the network 1640. The independent devices may be directly connected to the network 1640 without through the wireless stations 1651~1654. The video camera 1663 is an image capturing apparatus capable of capturing a video image like a digital video camera. The mobile phone 1664 may employ at least one of communication methods among various protocols such as personal digital communications (PDC), code division multiple access (CDMA), wideband code division multiple access (W-CDMA), global system for mobile communications (GSM), and personal handyphone system (PHS).

Figure 17:
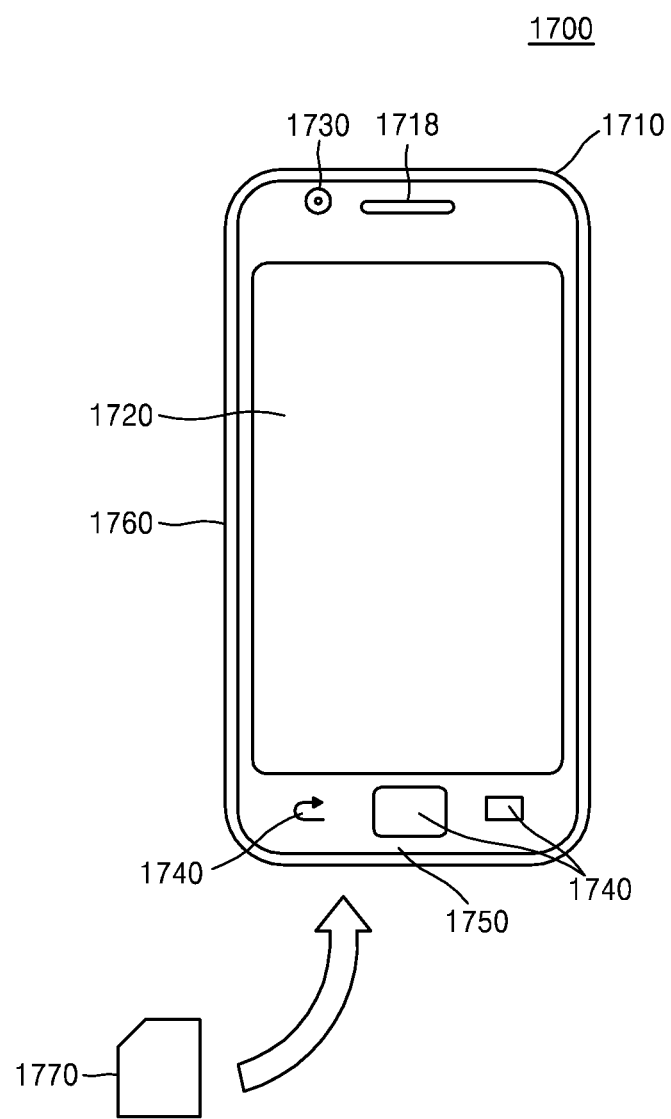
FIG. 17 illustrates an example of a mobile terminal equipped with a memory system, according to certain embodiments.

FIG. 17 illustrates an example of a mobile terminal 1700 equipped with a memory system, according to certain embodiments. The mobile terminal 1700 of FIG. 17 may correspond to the mobile phone 1664 of FIG. 16 and may be equipped with the memory system that is embodied by the second device 140. The mobile terminal 1700 may be a smartphone having functions that are not limited, in which a considerable portion of the functions may be modified or expanded through application programs. The mobile terminal 1700 may include a built-in antenna 1710 to exchange RF signals with a wireless station and a display screen 720 such as a liquid crystal display (LCD) screen or an organic light-emitting diode (OLED) screen to display images that are captured by a camera 1730 or received through the built-in antenna 1710 and decoded. The mobile terminal 1700 may include an operation panel 1740 including a control button and/or a touch panel. Also, when the display screen 1720 is a touch screen, the operation panel 1740 may further include a touch detecting panel of the display screen 1720. The mobile terminal 1700 may include a sound output unit such as a speaker 1780, or in other form, for outputting voice and sound and a sound input unit such as a microphone 1750, or in another form, for inputting voice and sound. The mobile terminal 1700 may further include the camera 1730 such as a charge-coupled device (CCD) camera to capture a still image. Also, the mobile terminal 1700 may include a storage medium 1770 for storing data that is coded and decoded like video or still images that are captured by the camera 1730, received via e-mails, or acquired in other forms, and a slot 1760 for installing the storage medium 1770 in the mobile terminal 1700. The storage medium 1770 may be embodied by the memory system of the second device 140 of FIG. 1.

As described above, in the memory system according to exemplary embodiments of the present inventive concept, and the electronic device including the memory system, since a delay of the second operation of using the data provided to the main memory, which may be caused by the first operation of providing the data to the main memory, is reduced, the second operation may be performed before the first operation is completed. Also, an operation speed may be increased.

In the memory system according to exemplary embodiments of the present inventive concept and the electronic device including the memory system, since the memory controller performs a copy operation in the main memory in a device, a bandwidth required by memory access and consumption of power may be reduced.

While the inventive concept has been particularly shown and described with reference to exemplary embodiments thereof, it will be understood that various changes in form and details may be made therein without departing from the spirit and scope of the following claims.

What is claimed is:

1. A memory system processing data according to a received first request, the memory system comprising:
 a first memory comprising a first area and a second area, and configured to provide data from the first area to the second area; and
 a memory controller comprising a scoreboard configured to indicate that a first piece of sub-data of a first set of sub-data of the data has been provided from the first area to the second area,
 wherein, based on the scoreboard, the memory controller is configured to perform processing of the first request by using the first piece of sub-data before providing of other pieces of sub-data of the first set of sub-data from the first area to the second area is completed, and
 wherein the scoreboard is configured to:
 store an in-use bit indicating whether provision of the first set of sub-data of the data to the second area is being performed,
 store a tag indicating a start address of the second area, and
 store a plurality of full/empty bits respectively indicating whether each piece of sub-data of the first set of sub-data has been provided to a respective sub-area of the first set of sub-areas of the second area.

2. The memory system of claim 1, wherein the first memory comprises a three-dimensional memory array.

3. The memory system of claim 1, wherein the scoreboard comprises a first register set comprising a first register configured to store the in-use bit, a second register configured to store the tag, and a plurality of third registers each configured to store each of the plurality of full/empty bits corresponding to the first set of sub-areas of the second area.

4. The memory system of claim 3, wherein the first request is processed in units of macro operations, the second area is set to have a size corresponding to the units of macro operations, and the plurality of third registers are provided in a number corresponding to the units of macro operations.

5. The memory system of claim 4, wherein the memory controller differently sets a size of each of the plurality of sub-areas indicated by one of the plurality of third registers according to a size of the data required for processing the first request.

6. The memory system of claim 3, wherein the memory controller comprises at least a second additional register set indicating whether provision of a second set of sub-data of the data has been provided to a second set of sub-areas of the second area,
- wherein the plurality of third registers of the first register set comprises m registers each having k data bits, and a plurality of third registers of the second register set comprises n registers each having l data bits, m is equal to or different from n and k is equal to or different from l, and
- wherein the memory controller is configured to assign one of the first register set and the second register set based on a size of the data required for processing the first request.

7. The memory system of claim 1, wherein, when an i-th sub-data and an (i+1)th sub-data of the first set of sub-data are sequentially transmitted to the second area, and one of the plurality of full/empty bits indicates that the i-th sub-data is the last sub-data transmitted to the second area, the memory controller is configured to process the first request on the first set of sub-data up to the i-th sub-data and then interlock-process the first request on the (i+1)th sub-data.

8. The memory system of claim 1, wherein a result of the processing of the first request by using the first set of sub-data provided to the second area has been provided to a third area of the first memory, and the memory controller is configured to process a second request by using data provided to the third area, before an operation performed based on the first request is completed.

9. A memory system processing data according to a received first request, the memory system comprising:
- a first memory comprising a first area and a second area, and configured to provide data from the first area to the second area; and
- a memory controller comprising a scoreboard configured to indicate that a first piece of sub-data of a first set of sub-data of the data has been provided from the first area to the second area,
- wherein, based on the scoreboard, the memory controller is configured to perform processing of the first request by using the first piece of sub-data before providing of other pieces of sub-data of the first set of sub-data from the first area to the second area is completed, and
- wherein the memory controller comprises:
  - a control circuit configured to generate a first control signal indicating a control operation to process the first request;
  - a scoreboard checking circuit configured to generate a second control signal based on a result of checking the scoreboard in response to the first control signal;
  - a performing circuit configured to perform transmission of the data from the first area to the second area in a unit of a piece of sub-data, perform the first request by using the sub-data transmitted to the second area in response to the second control signal, and generate a third control signal; and
  - a scoreboard updating circuit configured to update the scoreboard in response to the third control signal and generate a fourth control signal based on a result of the updating.

10. The memory system of claim 9, wherein the first request is for all pieces of sub-data of the first set of sub-data, the memory controller further comprises a mode setting circuit that is configured to control the control circuit, the scoreboard checking circuit, the performing circuit, and the scoreboard updating circuit so that the first request is performed after the all of pieces of sub-data of the first set of sub-data are all transmitted from the first area to the second area, in response to a mode signal.

11. The memory system of claim 1, wherein the first request is received from a first device that is located outside the memory system and the first device is configured to execute an application related to the first request.

12. The memory system of claim 1, further comprising a second memory that is configured to transmit data corresponding to the first request to the first memory or store data processed corresponding to the first request.

13. A semiconductor device comprising:
- a first register set including a first set of registers configured to:
  - indicate whether a first operation is being performed on a second area of a memory including a first area and the second area; and
  - indicate whether the first operation is completed on a first sub-area of a first set of sub-areas of the second area; and
- a second register set including a second set of registers configured to:
  - indicate whether the first operation is being performed on a second set of sub-areas of the second area; and
  - indicate whether the first operation is completed on a first sub-area of the second set of sub-areas,
- wherein the semiconductor device is configured to, while the first operation is being performed on the other sub-areas of the second area, perform a second operation on the second area by using data resulting from the first operation on the first sub-area, and
- wherein the semiconductor device is configured so that the memory performs the second operation on the first sub-area of the second set of sub-areas when the second register set indicates that the first operation is completed on the first sub-area of the second set of sub-areas.

14. The semiconductor device of claim 13, wherein the first operation includes copying data from the first area to the second area of the memory, or loading data after an arithmetic operation or an imaging operation.

15. The semiconductor device of claim 14, wherein the first set of registers includes:
- a first register configured to indicate whether the first operation is being performed on the first set of sub-areas; and
- each of a second plurality of registers configured to indicate whether the first operation is completed on the first sub-area of the first set of sub-areas,
- wherein each sub-area if the first set of sub-areas has m bits, m is a natural number greater than 2.

16. The semiconductor device of claim 15, wherein the second set of registers includes:
- a first register configured to indicate whether the first operation is being performed on the second set of sub-areas; and
- each of a second plurality of registers configured to indicate whether the first operation is completed on the first sub-area of the second set of sub-areas,
- wherein each sub-area of the second set of sub-areas has n bits, n is a natural number equal to or different from m.

* * * * *